US 11,447,868 B2

(12) United States Patent
Nguyen et al.

(10) Patent No.: US 11,447,868 B2
(45) Date of Patent: Sep. 20, 2022

(54) METHOD FOR CONTROLLING A PLASMA PROCESS

(71) Applicant: Applied Materials, Inc., Santa Clara, CA (US)

(72) Inventors: Andrew Nguyen, San Jose, CA (US); Kartik Ramaswamy, San Jose, CA (US); Michael G. Chafin, Santa Clara, CA (US); Yang Yang, San Diego, CA (US); Anilkumar Rayaroth, Santa Clara, CA (US); Lu Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 637 days.

(21) Appl. No.: 15/606,739

(22) Filed: May 26, 2017

(65) Prior Publication Data
US 2018/0342375 A1    Nov. 29, 2018

(51) Int. Cl.
*C23C 16/46*    (2006.01)
*C23C 16/458*    (2006.01)
(Continued)

(52) U.S. Cl.
CPC .......... *C23C 16/4586* (2013.01); *C23C 16/46* (2013.01); *C23C 16/481* (2013.01);
(Continued)

(58) Field of Classification Search
CPC .......... H01J 37/32091; H01J 37/32366; H01J 37/321; H01J 37/32174; H01J 37/334;
(Continued)

(56) References Cited

U.S. PATENT DOCUMENTS

| | | | | |
|---|---|---|---|---|
| 4,951,009 A * | 8/1990 | Collins | .............. | G01R 33/3628 333/17.3 |
| 5,815,047 A * | 9/1998 | Sorensen | ................. | H03H 7/40 315/111.21 |
| 6,313,584 B1 * | 11/2001 | Johnson | ............ | H01J 37/32082 315/111.21 |
| 7,112,926 B2 * | 9/2006 | Himori | ............. | H01J 37/32082 315/111.21 |

(Continued)

FOREIGN PATENT DOCUMENTS

WO    WO-2015128006 A1 *    9/2015

OTHER PUBLICATIONS

"Plasma." Merriam-Webster.com. Merriam-Webster, 2019. Web. Aug. 28, 2019.*
"Capacitor" definition—Brittanica (accessed Sep. 23, 2020).*

*Primary Examiner* — Benjamin Kendall
*Assistant Examiner* — Kurt Sweely
(74) *Attorney, Agent, or Firm* — Patterson + Sheridan, LLP

(57) ABSTRACT

Embodiments of the disclosure relate to apparatus and method for a tunable plasma process within a plasma processing chamber. In one embodiment of the disclosure, a heater assembly for a plasma processing chamber is disclosed. The heater assembly includes a resistive heating element, a first lead coupling the resistive heating element to an RF filter and a tunable circuit element operable to adjust an impedance between the resistive heating element and the RF filter. Another embodiment provides a method for controlling a plasma process in a plasma processing chamber by forming a plasma from a process gas present inside the plasma processing chamber and adjusting an impedance between a resistive heating element and an RF filter coupled between the resistive heating element and a power source for the resistive heating element, while the plasma is present in the plasma processing chamber.

8 Claims, 6 Drawing Sheets

(51) Int. Cl.
*C23C 16/48* (2006.01)
*H01J 37/32* (2006.01)

(52) U.S. Cl.
CPC ........ *C23C 16/458* (2013.01); *C23C 16/4583* (2013.01); *H01J 37/321* (2013.01); *H01J 37/32091* (2013.01); *H01J 37/32183* (2013.01); *H01J 37/32724* (2013.01)

(58) Field of Classification Search
CPC ............... H01J 37/327; H01J 37/32183; H01J 37/32385; H01J 37/32394; H01J 37/32724; H01J 37/33082; H01J 37/32715; H01J 37/32137; H01J 37/32431; H01J 37/32577; H01J 37/32605; H01J 37/32082–321; H01L 21/0262; H01L 21/68714; H01L 21/68785; H01L 21/68792; H01L 21/67069; H03H 7/38; H03H 7/40; C23C 14/50; C23C 14/541; C23C 16/4583; C23C 16/4586; C23C 16/46; C23C 16/505; C23C 16/509; C23C 16/45536–45544; C23C 16/4585; C23C 16/458; C23C 16/481
See application file for complete search history.

(56) References Cited

U.S. PATENT DOCUMENTS

| | | | | |
|---|---|---|---|---|
| 7,132,040 | B2* | 11/2006 | Yamagishi | H01J 37/32082 204/298.08 |
| 7,777,599 | B2* | 8/2010 | Shannon | H01J 37/32091 315/111.21 |
| 8,578,879 | B2* | 11/2013 | Ramaswamy | H01P 7/04 118/723 I |
| 8,992,723 | B2* | 3/2015 | Sorensen | H01J 37/32091 156/345.43 |
| 2003/0000733 | A1* | 1/2003 | Mohan | H02G 5/025 174/149 B |
| 2004/0165330 | A1* | 8/2004 | Wolinsky | H01R 25/14 361/115 |
| 2011/0126765 | A1* | 6/2011 | Yamazawa | H01J 37/32091 118/723 MW |
| 2014/0302256 | A1* | 10/2014 | Chen | H01J 37/32183 427/569 |
| 2015/0243483 | A1* | 8/2015 | Chen | H01J 37/32174 156/345.48 |
| 2016/0049917 | A1* | 2/2016 | Anwar | H03H 7/40 216/68 |
| 2017/0040966 | A1* | 2/2017 | Ella | H03H 7/0115 |
| 2017/0117869 | A1* | 4/2017 | Leeser | H01J 37/32183 |
| 2018/0139834 | A1 | 5/2018 | Nagashima et al. | |
| 2018/0309423 | A1 | 10/2018 | Okunishi et al. | |

* cited by examiner

METHOD FOR CONTROLLING A PLASMA PROCESS

BACKGROUND

Field

Embodiments of the disclosure generally relate to apparatus and method related to semiconductor manufacturing processes. More particularly, the disclosure relates to controlling a plasma process within a plasma processing chamber.

Description of the Related Art

Semiconductor substrates undergo a variety of processes like annealing implanting, etching and deposition of materials on the substrates during manufacturing. Many of these processes occur in presence of a plasma in a plasma processing chamber. RF power used to generate a plasma in the plasma processing chamber may be electrically coupled to a resistive heating element embedded in a substrate support used to hold a substrate in the plasma processing chamber. Consequently, some of the RF power is dissipated in the resistive heating element. Thus, plasma uniformity is affected in areas proximate to the resistive heating element.

Therefore, there is a need for an improved apparatus and method for controlling a plasma process within a plasma processing chamber.

SUMMARY

Embodiments of the disclosure relate to apparatus and method for controlling a plasma process within a plasma processing chamber. In one embodiment of the disclosure, a heater assembly for a plasma processing chamber is disclosed. The heater assembly includes a resistive heating element, a first lead coupling the resistive heating element to an RF filter and a tunable circuit element operable to adjust an impedance between the resistive heating element and the RF filter.

Another embodiment of the disclosure provides a plasma processing chamber including a chamber body having an interior volume, a substrate support disposed in the interior volume, a first resistive heating element, a first lead coupling the first resistive heating element to a first RF filter and a first tunable circuit element operable to adjust an impedance between the first resistive heating element and the first RF filter.

Yet another embodiment of the disclosure provides a method for controlling a plasma process in a plasma processing chamber. The method includes forming a plasma from a process gas present inside the plasma processing chamber and adjusting an impedance between a resistive heating element and an RF filter coupled between the resistive heating element and a power source for the resistive heating element, while the plasma is present in the plasma processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

Figure 1:
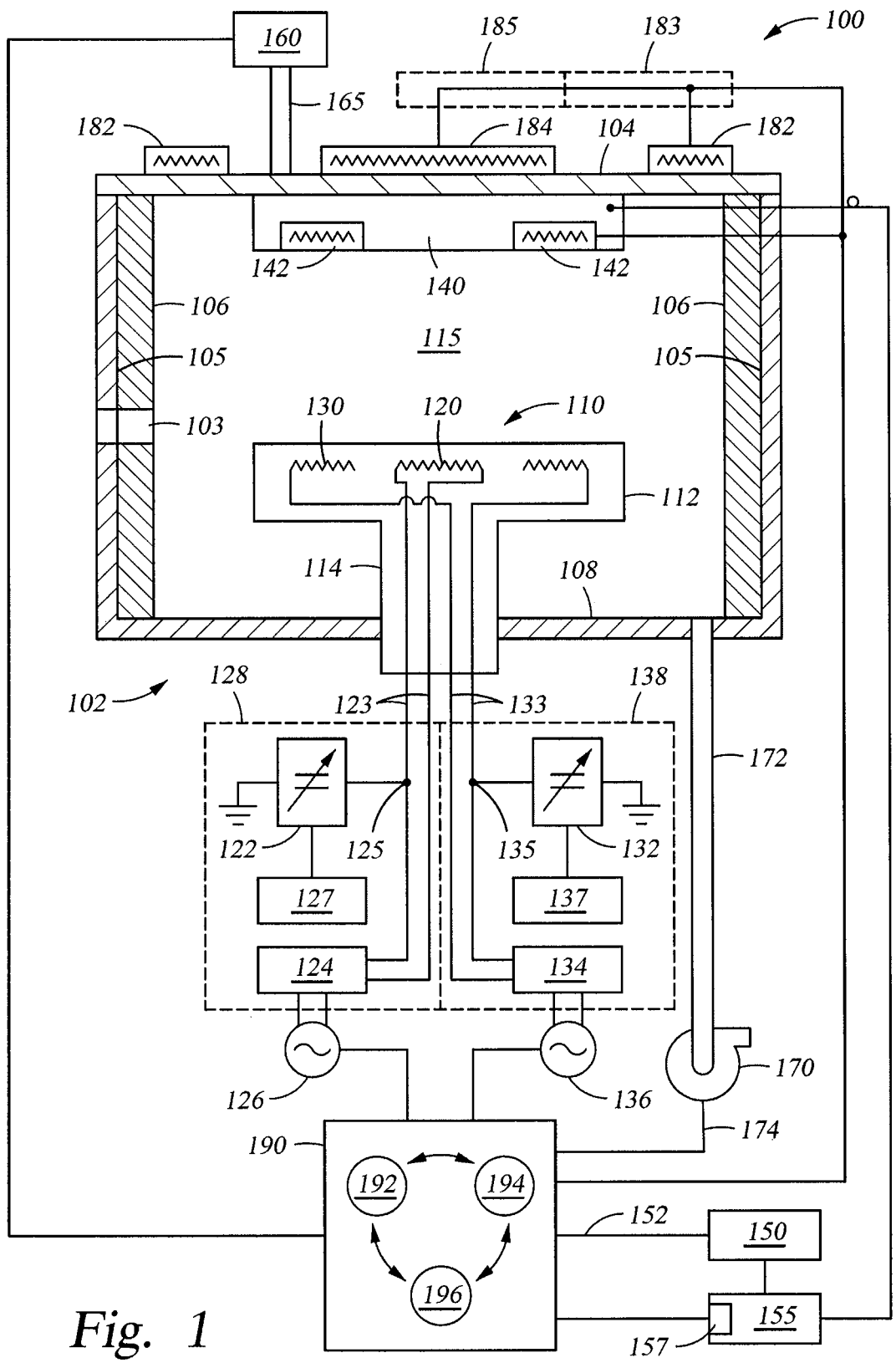
FIG. 1 is a schematic, cross-sectional view of a plasma processing chamber, for controlling a plasma process generated by a capacitatively coupled plasma within.

To facilitate understanding, identical reference numerals have been used, where possible, to designate identical elements that are common to the figures. It is contemplated that elements and features disclosed in one embodiment may be beneficially incorporated in other embodiments without specific recitation.

DETAILED DESCRIPTION

The disclosure described herein demonstrates apparatus and method for controlling a plasma generated within a plasma processing chamber by an RF power source. This is accomplished by using a tunable circuit element between a resistive heating element and an RF filter connected to the power source of the resistive heating element. The tunable circuit element is used to adjust an impedance between the resistive heating element and the RF filter such that the dissipation of RF power into the resistive heating element is controlled. As a result, the amount of RF power available to generate the plasma can be controlled to tune the strength and uniformity of the plasma.

FIG. 1 is a schematic, cross-sectional view of a plasma processing chamber 100 for controlling a plasma process within. The plasma processing chamber 100 may be a plasma etching chamber. Examples of plasma etching chambers that may be adapted to benefit from the disclosure include the Mesa™, Centris™, Sym3™, Producer® etching chambers available from Applied Materials, Inc. of Santa Clara, Calif. FIG. 1 described herein is illustrative of a plasma etching chamber, though the plasma processing chamber 100 described herein should not be construed or interpreted as limiting the scope of the embodiments described herein. The embodiments described can be equally applied to those chambers for deposition, implanting, annealing, and plasma-treating materials on semiconductor substrates.

As shown in FIG. 1, the plasma processing chamber 100 includes a chamber body 102 with an interior volume 115. The chamber body 102 has sidewalls 105, a bottom wall 108 and a lid 104. A chamber liner 106 is disposed inside the sidewalls 105 to protect the sidewalls 105 during plasma processing. The sidewalls 105, the bottom wall 108 and the lid 104 may be formed from conductive materials, such as aluminum or stainless steel. In certain embodiments, the lid 104 may be fabricated from an RF transmissive material such as ceramic. The sidewalls 105 and the bottom wall 108 may be electrically grounded during operation of the chamber 100.

The chamber body 102 has an inlet port 103 for transferring substrates to and from a substrate support 110 disposed in the interior volume 115 of the plasma processing chamber 100. A process gas source 160 is fluidly connected by a gas conduit 165 to the interior volume 115 for providing one or more processing gases. A pump 170 is fluidly connected by a conduit 172 to the interior volume 115 to pump out the processing gas during plasma processing.

A showerhead 140 is coupled to the lid 104 such that the processing gases from the process gas source 160 enter the interior volume 115 through the showerhead 140. The showerhead 140 may be formed from a ceramic material. The showerhead 140 may include one or more showerhead resistive heating elements 142 placed within. The showerhead resistive heating element 142 is configured to heat the interior volume 115 and/or the showerhead 140. One or more resistive heating elements may be disposed on the lid 104 of the plasma processing chamber 100. In the some embodiments, an outer lid resistive heating element 182 and an inner lid resistive heating element 184 are disposed on or in the lid 104. The outer lid resistive heating element 182 and the inner lid resistive heating element 184 are configured to heat the interior volume 115 and/or various components of the plasma processing chamber 100.

As mentioned above, the substrate support 110 is disposed within the interior volume 115 of the plasma processing chamber 100. The substrate support 110 has a stem 114 and a substrate-supporting member 112 supported by the stem 114. The substrate-supporting member 112 may be made of a ceramic material. The substrate-supporting member 112 has at least one resistive heating element 120 embedded therein. In the embodiment depicted in FIG. 1, a second resistive heating element 130 is disposed within the substrate-supporting member 112 radially outward to and surrounding the resistive heating element 120. The resistive heating element 120 is coupled to an RF filter 124 by a lead 123. The resistive heating element 130 is coupled to an RF filter 134 by a lead 133. The RF filters 124, 134 may be a high-pass or a low-pass filter. AC power sources 126 and 136 are coupled to the resistive heating elements 120 and 130 via the RF filters 124 and 134 respectively. The RF filters 124, 134 prevent RF current dissipated through the leads 123, 133 from reaching the AC power sources 126, 136.

A tunable circuit element 122 is connected at a node 125 on one of the leads 123 routed between the resistive heating element 120 and the RF filter 124. Similarly, another tunable circuit element 132 is connected at a node 135 on one of the leads 133 routed between the resistive heating element 130 and the RF filter 134. The tunable circuit elements 122, 132 may be a capacitor having constant or variable capacitance. The tunable circuit element 122 is connected to the node 125 at one end and grounded at the other end. In some embodiments, an actuator 127 is coupled to the tunable circuit element 122. The actuator 127 is configured to move the tunable circuit element 122 such that the node 125 is positionable along the lead 123 to change the distance between the tunable circuit element 122 and the RF filter 124. By changing the position of the node 125 and/or the capacitance of the capacitor in the tunable circuit element 122, the impedance between the resistive heating element 120 and the RF filter 124 may be adjusted. This enables the plasma density proximate to the resistive heating element 120 to be controlled. The tunable circuit element 132 is substantially similar in nature and function to the tunable circuit element 122 and is configured to adjust the impedance between the resistive heating element 130 and the RF filter 134, thus enabling the plasma density proximate to the resistive heating element 130 to be controlled.

A circuit 128 incorporating the lead 123, the tunable circuit element 122 and the RF filter 124 between the resistive heating element 120 and the AC power source 126 is thus configured to control the plasma density proximate to the resistive heating element 120. Similarly, a circuit 138 incorporating the lead 133, the tunable circuit element 132 and the RF filter 134 between the resistive heating element 130 and the AC power source 136 is thus configured to control the plasma density proximate to the resistive heating element 130. The circuits 128 and 138 are substantially similar in nature and function due to the presence of similar circuit elements.

The tunable circuit elements within the circuits such the tunable circuit elements 122, 132 within the circuit 128, 138 can be used to control effects of any combination of multiple zones heated by multiple resistive heating elements. For example, The outer lid resistive heating element 182, the inner lid resistive heating element 184 and the showerhead resistive heating element 142 may optionally be equipped with the same tunable circuit element, described above, such that the impedance between any of the resistive heating elements and an RF filter coupling the resistive heating element to a power source for the resistive heating element may be adjusted. Thus the plasma density proximate to any of the resistive heating elements can be controlled. For example, the outer lid resistive heating element 182 may be electrically coupled by a circuit 183 to a power source for the outer lid resistive heating element 182. Similarly, the inner lid resistive heating element 184 may be electrically coupled by a circuit 185 to a power source for the inner lid resistive heating element 184. The circuits 183, 185 are substantially similar in nature and function to the circuits 128, 138 due to the presence of similar circuit elements—a lead, a tunable circuit element and an RF filter as described above. Thus, the circuits 183, 185 are configured to control the plasma density proximate to the resistive heating elements 182, 184 respectively.

Figure 2:
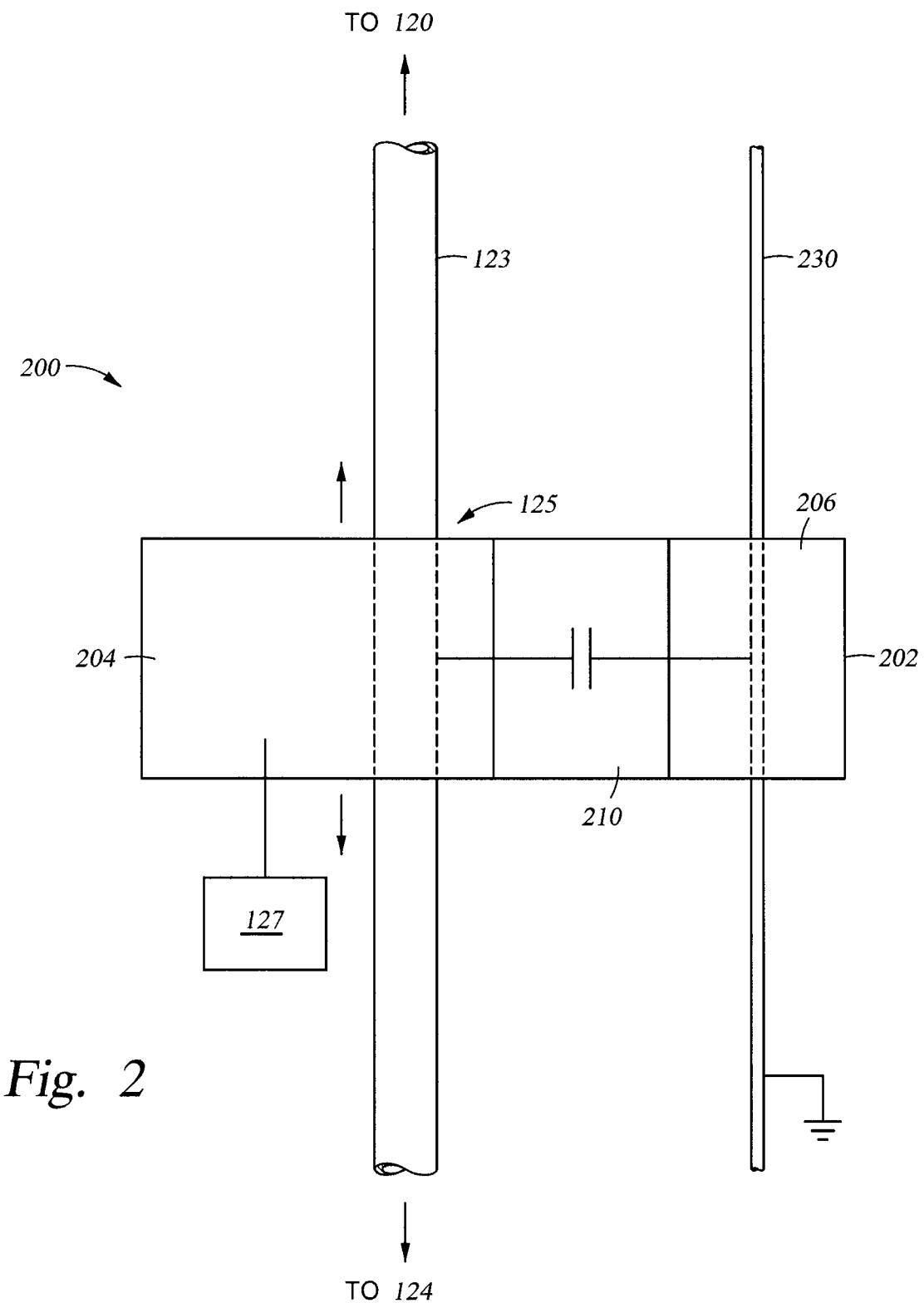
FIG. 2 is a tunable circuit element for controlling a plasma within the plasma processing chamber of FIG. 1, according to a first embodiment of the present disclosure.

FIG. 2 is a first embodiment of a tunable circuit element for controlling a plasma within the plasma processing chamber 100. The tunable circuit element 200 can be utilized as either or both of the tunable circuit elements 122 and 132 of FIG. 1. As shown in FIG. 2, the tunable circuit element 200 is connected between the resistive heating element 120 and the RF filter 124. The tunable circuit element 200 has a body 202 including a support plate 204, a capacitor 210 and a bracket 206. One end of the capacitor 210 is mechanically and electrically coupled to the bracket 206. The bracket 206 is mechanically and electrically coupled to a busbar 230, which is grounded. The other end of the capacitor 210 is mechanically and electrically coupled to the support plate 204. The support plate 204 is coupled to the linear actuator 127 described above. The support plate 204 is also coupled to the lead 123 at the node 125. The linear actuator 127 is configured to move the support plate 204 such that the node 125 is positionable along the lead 123 to change the distance between the capacitor 210 and the RF filter 124, which adjusts the impedance between the resistive heating element 120 and the RF filter 124, thus controlling the plasma density proximate to the resistive heating element 120.

Figure 3:
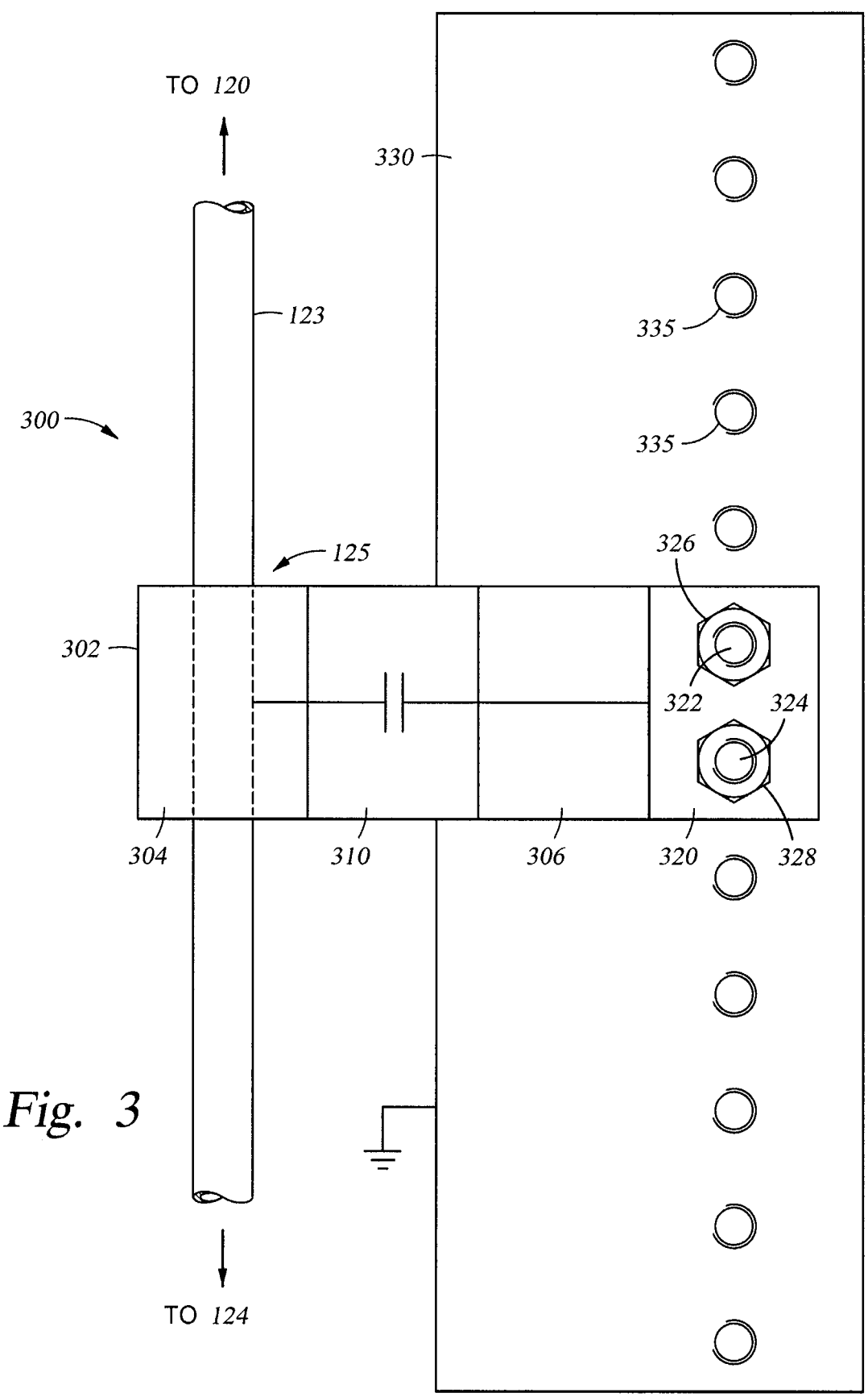
FIG. 3 is a tunable circuit element for controlling a plasma within the plasma processing chamber of FIG. 1, according to a second embodiment of the present disclosure.

FIG. 3 is a second embodiment of a tunable circuit element for controlling a plasma within the plasma processing chamber 100. The tunable circuit element 300 can be utilized as either or both of the tunable circuit elements 122 and 132 of FIG. 1. As shown in FIG. 3, the tunable circuit element 300 is connected between the resistive heating element 120 and the RF filter 124. The tunable circuit element 300 has a body 302 including a support plate 304, a capacitor 310, a connector plate 306 and an adjustable bracket 320. One end of the capacitor is mechanically and electrically coupled to the support plate 304. The support plate 304 is also coupled to the lead 123 at the node 125. The other end of the capacitor is mechanically and electrically coupled by the connector plate 306 to the bracket 320. The bracket 320 is mechanically and electrically coupled to a busbar plate 330 having one or more holes 335 along its length. The busbar plate 330 is grounded. In the embodiment shown in FIG. 2, the bracket 320 is coupled to two of the holes 335 by screws 322, 324 on one end and washers 326, 328 on the other end. The bracket 320 is configured to be coupled to any of the holes 335 using the screws 322, 324 and the washers 326, 328 in order to change the distance between the capacitor 310 and the RF filter 124, which adjusts the impedance between the resistive heating element 120 and the RF filter 124, thus controlling the plasma density proximate to the resistive heating element 120.

Figure 4:
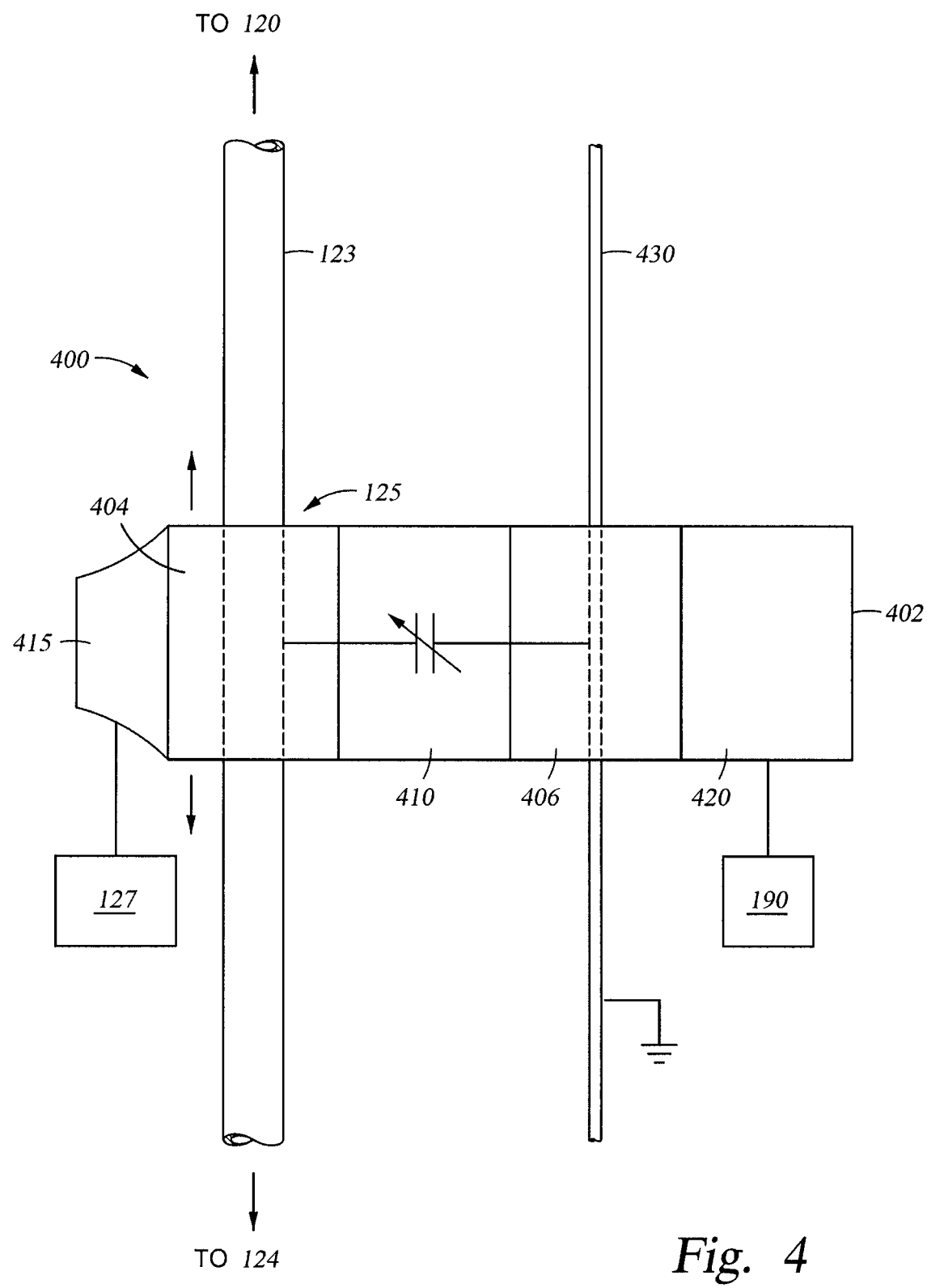
FIG. 4 is a tunable circuit element for controlling a plasma within the plasma processing chamber of FIG. 1, according to a third embodiment of the present disclosure.

FIG. 4 is a third embodiment of a tunable circuit element for controlling a plasma within the plasma processing chamber 100. The tunable circuit element 400 can be utilized as either or both of the tunable circuit elements 122 and 132 of FIG. 1. As shown in FIG. 4, the tunable circuit element 400 is connected between the resistive heating element 120 and the RF filter 124. The tunable circuit element 400 has a body 402 including a support plate 404, a variable capacitor 410, and a bracket 406. One end of the variable capacitor 410 is mechanically and electrically coupled to the support plate 404. The support plate 404 is coupled to the linear actuator 127 by a connector plate 415. The support plate 404 is also coupled to the lead 123 at the node 125. The linear actuator 127 is configured to move the support plate 404 such that the node 125 is positionable along the lead 123 to change the distance between the capacitor 410 and the RF filter 124, which adjusts the impedance between the resistive heating element 120 and the RF filter 124. The other end of the variable capacitor 410 is mechanically and electrically coupled to the bracket 406. The bracket 406 is mechanically and electrically coupled to the busbar 430, which is grounded. In some embodiments, the bracket 406 is also coupled to a motor 420 controlled by a controller 190. A capacitance of the capacitor 410 may also be manually changed to adjust the impedance between the resistive heating element 120 and the RF filter 124. The plasma density proximate to the resistive heating element 120 can thus be controlled by changing the distance between the capacitor 410 and the RF filter 124 and/or by changing the capacitance of the capacitor 410.

Referring back to FIG. 1, the plasma processing chamber is a capacitatively coupled plasma chamber 100 connected to a radio-frequency (RF) power source 150, which provides RF power to drive a capacitatively coupled plasma in the interior volume 115. The RF power source 150 provides RF power of up to about 40 kW, and at a frequency between about 400 KHz-162 MHz. An RF matching circuit 155 connects the plasma processing chamber 100 to the RF power source 150. A sensor 157 is disposed within the RF matching circuit 155 to detect a change in an electrical characteristic at the RF matching circuit 155. In one embodiment, the sensor 157 monitors and measures at least one or both of a voltage and current within the RF circuit which drives the plasma.

Figure 6:
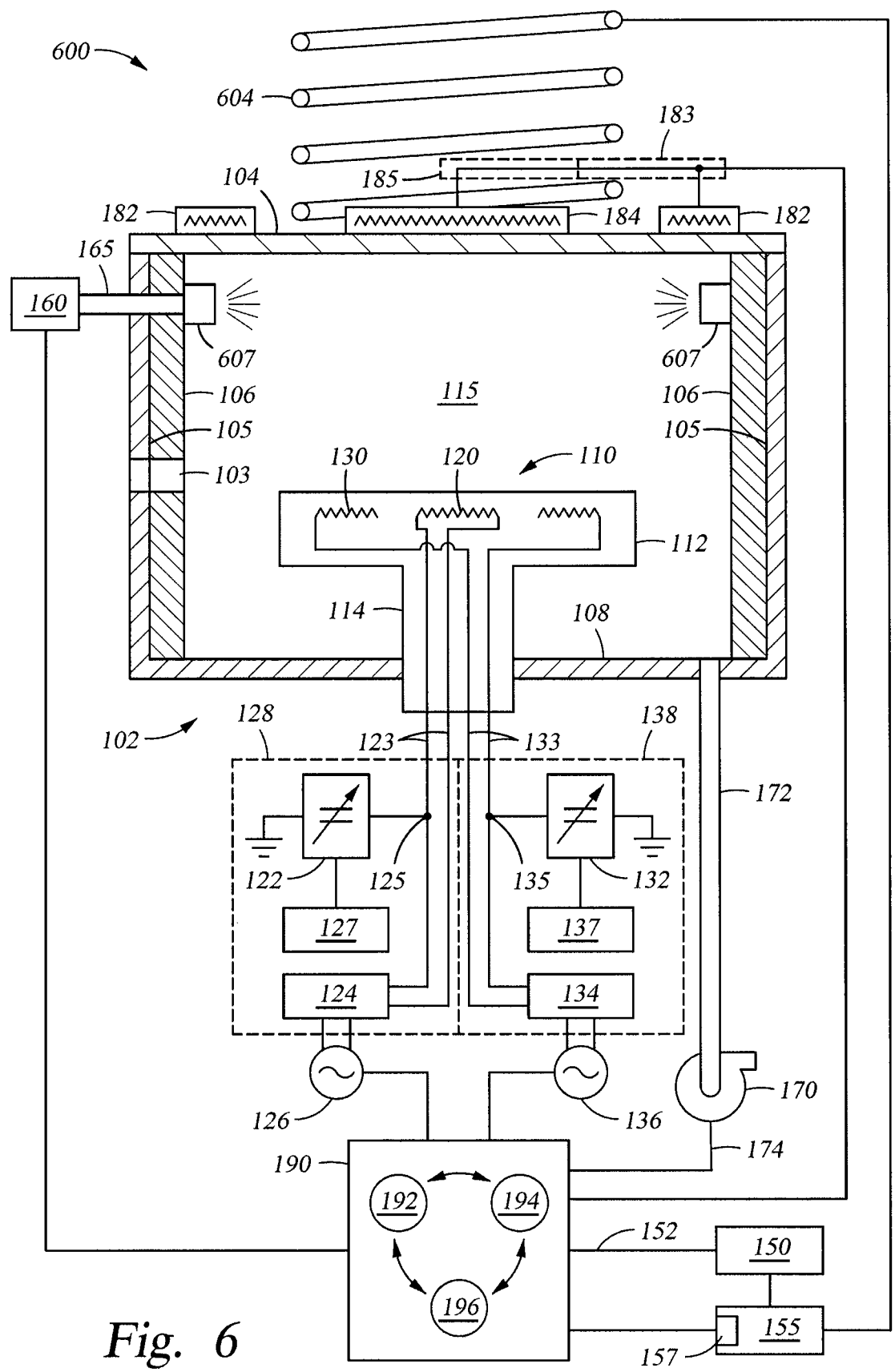
FIG. 6 is a schematic, cross-sectional view of a plasma processing chamber, for controlling a plasma process generated by an inductively coupled plasma within.

Alternatively, the plasma processing chamber could be configured as an inductively coupled plasma processing chamber 60 as shown in the embodiment of FIG. 6. Notably, the showerhead 140 is not present in the plasma processing chamber 600. One or more coils 604 are disposed above the lid 104, which is RF transmissive in nature. The coils 604 are coupled to the RF matching circuit. One or more nozzles 607 are disposed on the sidewalls 105 and/or the lid 104 of the plasma processing chamber 600. The nozzles 607 are configured to deliver one or more processing gases from the process gas 160 though the gas conduit 165 into the interior volume 115 of the plasma processing chamber 600. In this embodiment, the outer lid resistive heating element 182 and the inner lid resistive heating element 184 are designed as Faraday shields to reduce horizontal electric field. The change in the electric and magnetic fields coupled through the RF transmissive lid 104 cause the change in impedance in the outer lid resistive heating element 182 and the inner lid resistive heating element 184, thus controlling the plasma density proximate to the outer lid resistive heating element 182 and the inner lid resistive heating element 184.

Returning to FIG. 1, the controller 190 is configured to control the RF power source 150, the process gas source 160, the pump 170, the outer lid resistive heating element 182, the inner lid resistive heating element 184 and the showerhead resistive heating element 142 of the plasma processing chamber 100. The controller 190 is also configured to control the AC power sources 126 and 136. The controller 190 is communicatively connected to the sensor 157 in the RF matching circuit 155. In some embodiments, the controller may control the motor 420 to vary the capacitance of the capacitor 410 in the tunable circuit element 400. The controller 190 includes a central processing unit (CPU) 192, a memory 194, and a support circuit 196. The CPU 192 is any form of a general-purpose computer processor that may be used in an industrial setting. Software routines are stored in the memory 194, which may be a random access memory, a read-only memory, floppy, a hard disk drive, or other form of digital storage. The software routines may include programmed instructions for controlling the position of the substrates on the substrate support 110, flow of the processing gas from the process gas source 160, flow of the processing gas from the plasma processing chamber 100 to the pump 170, control of RF power from RF power source 150, control of AC power from the AC power sources 126 and 136, regulation of the outer lid resistive heating element 182, the inner lid resistive heating element 184 and the showerhead resistive heating element 142 of the plasma processing chamber 100, among others. The support circuit 196 is conventionally coupled to the CPU 192 and may include cache, clock circuits, input/output systems, power supplies, and the like.

The disclosure herein can be advantageously utilized to control the plasma generated in the plasma processing chamber 100. For example, during an etching process, substrates are initially loaded on the substrate support 110 through the inlet port 103 of the plasma processing chamber 100. The one or more resistive heating elements 120, 130 embedded within the substrate support 110 are electrically powered by AC power sources 126, 136 to heat the substrate support 110. At the same time, the showerhead resistive heating element 142, the outer the lid resistive heating element 182 and the inner lid resistive heating element 184 are turned on by the controller 190 to heat components of the chamber 100. A gas mixture that may include one or more etchants and one or more inert gases is delivered from the process gas source 160 into the interior volume 115 of the chamber 100. As shown in the embodiment of FIG. 1, a capacitatively coupled plasma is generated within the interior volume 115, formed from the gas mixture disposed between the showerhead 140 and the substrate support 110. Alternatively, as shown in the embodiment of FIG. 6, an inductively coupled plasma is generated by the coils 604 within the interior volume 115 of the plasma processing chamber 600.

The strength of the plasma generated in the interior volume 115 is controlled by adjusting the impedance between the resistive heating elements 120, 130 and the RF filters 124, 134 coupled between the resistive heating elements 120, 130 and the power sources 126, 136. This controls the plasma density and consequently the relative center-to-edge uniformity of the plasma proximate to the substrate support 110. As a result, a center-to-edge processing result can be controlled, where the processing result can be a rate of etching, uniformity of etching, among others.

As mentioned above, the tunable circuit elements 122, 132 comprise a constant or variable capacitor, shown in three different embodiments in FIGS. 2, 3 and 4. The impedance between the resistive heating elements 120, 130 and the RF filters 124, 134 can be adjusted by changing the distance between the tunable circuit elements 122, 132 and the RF filters 124, 134. However, optionally or additionally, the impedance can also be adjusted by varying the capacitance of the capacitor in the tunable circuit elements 122, 132. For example in FIG. 2, the capacitance of the constant capacitor 210 in the tunable circuit element 200 is changed by moving the support plate 204 up or down along the lead 123 using the linear actuator 127. The bracket 206 is connected to the grounded busbar 230 as the support plate 204 is moved up or down the lead 123 connecting the resistive heating elements 120 to the RF filter 124. The change in distance between the capacitor 210 and the RF filter 124 results in an adjustment in the impedance between the resistive heating element 120 and the RF filter 124.

Similarly, in FIG. 3, the capacitance of the constant capacitor 310 in the tunable circuit element 300 is changed by moving the bracket 320 up or down along the grounded busbar plate 330. The bracket 320 is fastened to one or more holes 335 on the busbar plate 330 using screws 322, 324 and washers 326, 328. The support plate 304 is connected to the lead 123 at the node 125 as the bracket 320 is moved up or down along the busbar plate 330. The change in distance between the capacitor 310 and the RF filter 124 results in an adjustment in the impedance between the resistive heating element 120 and the RF filter 124.

In FIG. 4, the capacitance of the variable capacitor 410 in the tunable circuit element 400 is changed by the motor 420, which is controlled by the controller 190. The capacitance of the variable capacitor 410 in the tunable circuit element can also be changed by moving the support plate 404 up or down along the lead 123 using the linear actuator 127. The bracket 406 is connected to the grounded busbar 430 as the support plate 404 is moved up or down the lead 123 connecting the resistive heating element 120 to the RF filter 124. The change in capacitance of the variable capacitor 410 and/or the change in distance between the capacitor 410 and the RF filter 124 results in an adjustment in the impedance between the resistive heating element 120 and the RF filter 124.

Optionally, the sensor 157 in the matching circuit 155 detects a change in the electrical characteristic and communicates the detected information to the controller 190. The controller 190 utilizes the information detected by the sensor 157 to determine how to adjust the impedance between the resistive heating elements 120, 130 and the RF filters 124, 134 in real-time, in response to the detected information. The information from the sensor 157 is indicative of the plasma condition. For example, the sensor 157 may detect the voltage or current from the RF power source 150 driving the plasma. The controller 190 accordingly adjusts the impedance between the resistive heating elements 120, 130 and the RF filters 124, 134 in order to adjust the plasma condition to a desirable state. The processing results, such as but not limited to, the rate and uniformity of etching, may be controlled by adjusting the plasma condition continuously.

The ability to control the plasma generated in the plasma processing chamber 100 is not limited to adjusting the impedances between the resistive heating elements 120, 130 and the RF filters 124, 134. One or more among the outer lid resistive heating element 182, the inner lid resistive heating element 184 and the showerhead resistive heating element 142 may be coupled to their respective power sources by a circuit comprising a tunable circuit element on a lead between the resistive heating element and an RF filter coupled between the resistive heating element and the respective power source. For example, as shown in the embodiment of FIG. 1, the outer lid resistive heating element 182 and the inner lid resistive heating element 184 are coupled to their respective power sources by the circuits 183 and 185, each comprising a lead between the resistive heating element and the respective power source, a tunable circuit element and an RF filter. By adjusting the impedance of the lead in the circuits 183 and 185, the plasma density proximate to the respective outer lid resistive heating element 182 and the inner lid resistive heating element 184 can be respectively controlled. Thus, the plasma density proximate to any of the resistive heating elements 120, 130, 182, 184, 142 may be controlled by adjusting the impedance between the resistive heating element and an RF filter coupled between the resistive heating element and the respective power source. Moreover, any combination of two or more resistive heating elements can be independently controlled using a tunable circuit element to achieve similar plasma processing results in substantially the same manner. For example, the center-to-edge relative uniformity of the plasma density proximate to the substrate support 110 can be controlled by adjusting the impedances of the resistive heating elements 120 and 130 relative to each other. Similarly, the center-to-edge relative uniformity of the plasma density proximate to the lid 104 can be controlled by adjusting the impedances of the outer lid resistive heating element 182 and the inner lid resistive heating element 184 relative to each other.

Figure 5:
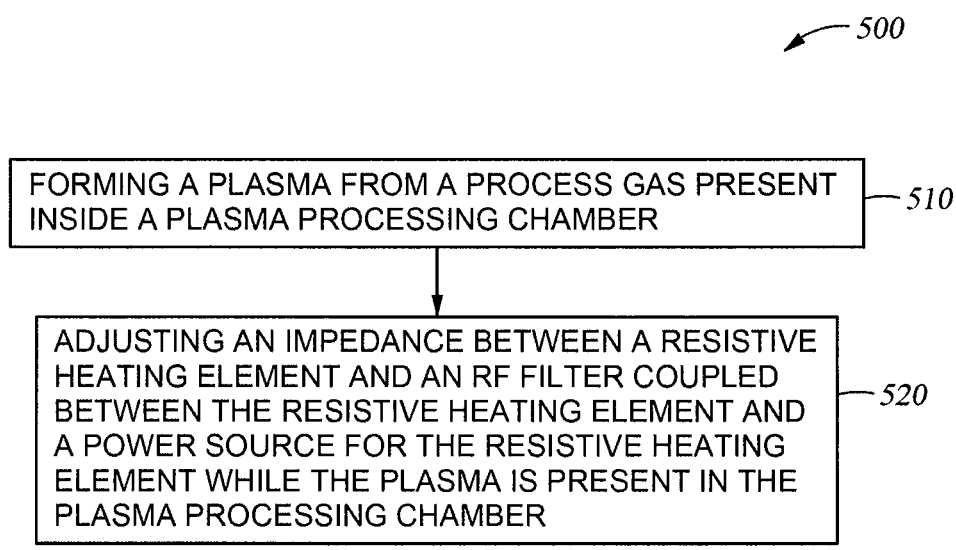
FIG. 5 is a block diagram of a method for controlling a plasma process within the plasma processing chamber.

FIG. 5 is a block diagram of a method 500 for controlling a plasma process within the plasma processing chamber, according to another embodiment of the present disclosure. The method 500 begins at block 510 by forming a plasma from a processing gas present in the plasma processing chamber. The power driving the plasma may be inductively-coupled or capacitatively-coupled. The processing gas is supplied by a process gas source to the interior volume of the chamber. The plasma thus generated may be used for a plasma process, such as but not limited to, etching, implanting, plasma-treating, or depositing a material on substrates in presence of the plasma. A substrate is loaded onto a substrate support disposed within the plasma processing chamber for plasma processing. One or more resistive heating elements are electrically powered by a power source to heat the substrate support or a component of the plasma processing chamber, such as one or more of a showerhead, a chamber lid, a chamber body, and a chamber liner, among others.

At block 520, the plasma process is controlled by adjusting impedance between a resistive heating element and an RF filter coupled between the resistive heating element and a power source for the resistive heating element, while the plasma is present in the plasma processing chamber. The impedance between the resistive heating element and the RF filter is adjusted by varying the impedance of a tunable circuit element placed between the resistive heating element and the RF filter. The tunable circuit element may have a constant or variable capacitor with one end grounded. The impedance of the tunable circuit element is changed by either changing a distance between the capacitor and the RF filter or by changing the capacitance of the capacitor, or both.

In some embodiments, the impedance between the resistive heating element and the RF filter is adjusted in response to a feedback received from a matching circuit coupled to plasma processing chamber. The matching circuit detects an electrical characteristic of the RF circuit that is powered by the RF power source to generate the plasma. The electrical characteristic may be voltage or current of the RF circuit, but is not limited as such. The frequency of the voltage or current in the RF circuit detected by the matching circuit is then used to adjust the impedance of the tunable circuit element, such that the frequency of the voltage or current between the resistive heating element and the power source is different from the RF frequency. This prevents resonance which maximizes RF power dissipation into the lead connecting the resistive heating element and the power source. The extent to which the plasma within the plasma processing chamber is controlled is determined by the extent to which the impedance between the resistive heating element and the RF filter can be varied.

The chamber 100, the tunable circuit elements 200, 300 and 400 as well as the method 500 described above provide an improved way of controlling a plasma process within a plasma processing chamber. The plasma formed in a plasma process can be controlled by varying the impedance between the resistive heating element and an RF filter coupled between the resistive heating element and a power source for the resistive heating element. For example, the application of plasma can be controlled by gradually changing the frequency of the circuit between the resistive heating element and the power source away from the RF frequency. Further, in some embodiments the impedance of the tunable circuit element can be continually adjusted by using feedback from the matching circuit coupled to the plasma processing chamber, which detects the voltage, current or another electrical characteristic of the RF circuit. Fundamentally, the disclosure enables a universal application of using a tunable circuit element between a resistive heating element and an RF filter coupled between the resistive heating element and a power source for the resistive heating element. The tunable circuit element is used to adjust an impedance between the resistive heating element and the RF filter such that the dissipation of RF power into the resistive heating element can be controlled. As a result, the amount of RF power available to generate the plasma can be controlled to tune the strength and uniformity of the plasma. The resistive heating element could be embedded in the substrate support or within any of components of plasma processing chamber.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. A method for controlling a plasma process in a plasma processing chamber comprising:
forming a plasma from a process gas present inside the plasma processing chamber, the plasma processing chamber comprising a tunable circuit element connected between an RF filter and a resistive heating element;
detecting a characteristic of a match circuit coupled to the plasma processing chamber, the characteristic being at least one of voltage and current; and
adjusting a position of the tunable circuit element along a grounded busbar plate to adjust a position of a node and a distance between the tunable circuit element and the RF filter along a lead to adjust an impedance of the tunable circuit element, wherein the tunable circuit element has a first end directly electrically connected to the lead at the node between the resistive heating element and the RF filter and a second end coupled to the grounded busbar plate, wherein adjusting the position of the tunable circuit element comprises moving the tunable circuit element from one of a plurality of apertures disposed along a length of the grounded busbar plate to another of the plurality of apertures along the length of the busbar plate.

2. The method of claim 1 further comprising changing a capacitance of the tunable circuit element to adjust the impedance between the resistive heating element and the RF filter.

3. The method of claim 1, wherein the tunable circuit element comprises a capacitor, and wherein adjusting the position of the tunable circuit element along the lead relative to the RF filter comprises:
changing a distance between the capacitor and the RF filter.

4. The method of claim 1, comprising implanting, etching, or depositing a material on substrates in presence of the plasma.

5. The method of claim 4, wherein adjusting the impedance between the resistive heating element and the RF filter comprises:
controlling a center-to-edge processing result.

6. The method of claim 1, further comprising:
applying power to the resistive heating element.

7. The method of claim 6, wherein the resistive heating element is configured to heat a substrate support or a component of the plasma processing chamber.

8. The method of claim 1 wherein the RF filter is coupled between the resistive heating element and a power source for the resistive heating element.

* * * * *